(12) United States Patent
Gittler et al.

(10) Patent No.: US 10,330,941 B2
(45) Date of Patent: Jun. 25, 2019

(54) METHOD FOR PRODUCING WINDOW ELEMENTS THAT CAN BE SOLDERED INTO A HOUSING IN A HERMETICALLY SEALED MANNER AND FREE-FORM WINDOW ELEMENTS PRODUCED IN ACCORDANCE WITH SAID METHOD

(71) Applicants: JENOPTIK Optical Systems GmbH, Jena (DE); Micro-Hybrid Electronic GmbH, Hermsdorf (DE)

(72) Inventors: Elvira Gittler, Jena (DE); Steffen Biermann, Hermsdorf (DE); Wolfgang Brode, Hermsdorf (DE); Falko Stoerzner, Kraftsdorf (DE)

(73) Assignee: JENOPTIK Optical Systems GmbH, Hermsdorf (DE)

( * ) Notice: Subject to any disclaimer, the term of this patent is extended or adjusted under 35 U.S.C. 154(b) by 676 days.

(21) Appl. No.: 14/939,385

(22) Filed: Nov. 12, 2015

(65) Prior Publication Data
US 2016/0062127 A1    Mar. 3, 2016

Related U.S. Application Data

(63) Continuation of application No. PCT/DE2014/100165, filed on May 13, 2014.

(30) Foreign Application Priority Data

May 13, 2013    (DE) .................. 10 2013 008 478

(51) Int. Cl.
*G01J 1/02*    (2006.01)
*G01J 5/04*    (2006.01)
(Continued)

(52) U.S. Cl.
CPC .......... *G02B 27/022* (2013.01); *G01J 1/0271* (2013.01); *G01J 5/045* (2013.01);
(Continued)

(58) Field of Classification Search
CPC ...... G02B 27/022; G02B 27/028; G02B 1/10; G02B 1/02; G02B 7/007; H01L 31/02325;
(Continued)

(56) References Cited

U.S. PATENT DOCUMENTS 5,882,988 A * 3/1999 Haberern .............. H01L 21/465
257/E21.485
7,468,293 B2 * 12/2008 Weyh ...................... G01J 5/08
257/680
(Continued)

FOREIGN PATENT DOCUMENTS

DE            4433521 A1    3/1995
DE    102005024512 B3    2/2007
(Continued)

OTHER PUBLICATIONS

International Search Report from PCT/DE2014/100165, filed May 13, 2014, dated Oct. 8, 2014.

Primary Examiner — Anita K Alanko
(74) Attorney, Agent, or Firm — Patentbar International, P.C.

(57) ABSTRACT

A method for production of window elements which can be soldered into a housing in a hermetically tight manner with optical coating and free-form window elements are disclosed. After application of optical coatings, a protective layer is applied to the optical coating, the two layer systems are selectively removed by means of a machining beam of high-energy radiation for the purpose of ablation of a desired optically active free-form surface for window elements with
(Continued)

any geometric shape through a localized machining beam in edge regions of the optically active free-form surface such that the protective layer remains on the optical coating as lift-off mask which is lifted off after applying a metallization for a solder layer by an etching process that acts selectively only on the protective layer but not on the optical coating, and the metallization remains only on the peripheral edge regions circumscribing the free-form surfaces.

17 Claims, 6 Drawing Sheets

(51) Int. Cl.
| | | |
|---|---|---|
| G01J 5/08 | (2006.01) | |
| G02B 1/02 | (2006.01) | |
| G02B 1/10 | (2015.01) | |
| G02B 7/00 | (2006.01) | |
| G02B 27/02 | (2006.01) | |
| H01L 31/0232 | (2014.01) | |
| C09K 13/00 | (2006.01) | |

(52) U.S. Cl.
CPC .............. *G01J 5/0875* (2013.01); *G02B 1/02* (2013.01); *G02B 1/10* (2013.01); *G02B 7/007* (2013.01); *G02B 27/028* (2013.01); *H01L 31/02325* (2013.01); *C09K 13/00* (2013.01)

(58) Field of Classification Search
CPC ........ G01J 5/045; G01J 1/0271; G01J 5/0875; C09K 13/00
See application file for complete search history.

(56) References Cited

U.S. PATENT DOCUMENTS

| | | | |
|---|---|---|---|
| 2004/0104460 A1* | 6/2004 | Stark ..................... | B81B 7/0067 257/678 |
| 2010/0035408 A1* | 2/2010 | Hoshino ................. | B24B 7/228 438/463 |
| 2014/0093688 A1* | 4/2014 | Chuo ................. | H01L 21/0331 428/156 |

FOREIGN PATENT DOCUMENTS

| | | |
|---|---|---|
| DE | 102007039291 A1 | 2/2009 |
| EP | 1727210 A2 | 11/2006 |
| JP | 01305542 A * | 12/1989 |
| JP | 11211555 A | 8/1999 |
| JP | 2009276691 A | 11/2009 |

* cited by examiner

METHOD FOR PRODUCING WINDOW ELEMENTS THAT CAN BE SOLDERED INTO A HOUSING IN A HERMETICALLY SEALED MANNER AND FREE-FORM WINDOW ELEMENTS PRODUCED IN ACCORDANCE WITH SAID METHOD

RELATED APPLICATIONS

This Application is a Continuation application of International Application PCT/DE2014/100165, filed on May 13, 2014, which in turn claims priority to German Patent Applications No. DE 10 2013 008 478.4, filed May 13, 2013, both of which are incorporated herein by reference in their entirety.

FIELD OF THE INVENTION

The invention is directed to a method for the production of window elements with optical coating which can be soldered into a housing in a hermetically tight manner and to free-form window elements produced in accordance with the method. Window elements of this type are particularly suitable for closing housings of radiation detectors or radiation sources in a hermetically tight (vacuum-tight) manner while ensuring optical functions, particularly spectral functions.

BACKGROUND OF THE INVENTION

A method for the production of window elements which can be soldered in a hermetically tight manner in which stray light or interference radiation is prevented from penetrating through the arrangement of an improved adherence layer system with barrier layer and interdiffusion layer is known in the prior art from DE 10 2005 024 512 B3. The window elements which are produced result from frame-shaped partial regions which are easy to work with because of their rectangular shape, but are limited with respect to their limiting of the beam width angle in minimized-surface sensors or detectors. Accordingly, in case of area sensors or image detectors having small dimensions, the window elements produced in this way result in limitations as regards adapting to the existing housing and in loss of quality.

Further, DE 10 2007 039 291 A1 discloses an optoelectronic semiconductor module which is outfitted with a light-emitting semiconductor chip mounted on a chip carrier, with a cover element having an at least partially permeable cover plate over the semiconductor chip, and with a frame part for laterally enclosing the semiconductor chip. The cover plate and frame part are connected to one another by anodic bonding without a joining layer. The frame part and chip carrier can be then be connected like conventional metal chip carriers and caps by soldering.

Further, it is also known to produce circular window elements individually and to glue these circular window elements into a housing according to their intended purpose.

However, a disadvantage consists in the related handling expenditure for individual fabrication and the limitation with respect to window size. Therefore, individual fabrication of area sensors, image detectors and endoscopes of small dimensions (1-5 mm) is very laborious and a method of this kind is accordingly unsuitable for series production. In addition, these elements are extremely prone to malfunction and are therefore also cost-intensive. Further, in the case of glued window elements the permeability (gas permeability) of the glue has a negative impact on the long-term stability of systems on this basis which require a 100-percent hermetically gastight (vacuum-compliance) joint. Only quasi-hermetic joints can be produced with glued windows. In contrast, hermetically gastight, temperature-resistant systems with long-term stability can be constructed with soldered window elements.

SUMMARY OF THE INVENTION

Against this background, the invention has the object of finding a better possibility for the production of optical window elements with optical coating which can be soldered into a housing in a hermetically tight manner, which permit a hermetically gastight or vacuum-tight solder connection with the metal housing that is reliable over the long term even under alternating thermal load and which also minimize the penetration of stray radiation and interference radiation into the layer system of the optical coating.

To this end, it should be possible to provide window elements with flexible shape variants (free-form windows) from optically transparent, flat substrate material, which window elements can be produced in a cost-efficient manner in a required small format in the range between 1 mm and 100 mm, which can be soldered in a hermetically tight (vacuum-tight) manner and which are stable over the long term for the above-mentioned applications.

Within the meaning of the invention, "free-form surfaces" of optical windows means window elements which—preferably plane-parallel with respect to the flat basic shape, but in specific cases also with integrated optical lenses and/or filter functions—are formed such that the surface contour shape is round, oval, crescent-shaped, polyangular, e.g., triangular, rectangular, polygonal or forms a half-circle, a third of a circle or a fourth of a circle, etc. All of the shapes can preferably also be formed with rounded corners. The contour shape can also be freely defined in accordance with the intended use of the window elements.

In a method for the production of window elements which can be soldered into a housing in a hermetically tight manner with optically transparent, flat substrate material having a dimensioning sufficient for a plurality of window elements, the above-stated object is met according to the invention through the following steps consecutively:

a) applying at least one optical coating to at least one surface of the optically transparent, flat substrate material, b) coating the optical coating with a protective layer which is an etchable layer, meaning a sacrificial layer, c) selectively removing the protective layer and the optical coating from the substrate material in that, for window elements with any geometric shape, at least one required optically active free-form surface is ablated through localized machining by means of a directed machining beam of high-energy radiation in edge regions circumscribing the periphery of the at least one optically active free-form surface such that the protective layer remains on the optical coating as a mask which completely covers the at least one required optically active free-form surface, d) ablating a portion of the substrate material along the locally machined peripheral edge region by means of the directed machining beam of high-energy radiation such that at least one lowered step having a defined roughness is formed in the locally machined edge region of the substrate material, wherein the at least one step lies below a height level of the substrate material at which the optical coating is disposed by more than the single layer thickness of the optical coating, e) coating a surface of the substrate material having the optical coating covered by the protective layer and having the locally machined peripheral edge region of the at least one window element through overlaying metallization of the aforementioned surface with a solder layer system, and f) removing the metallization over the optical coating by means of an etching process which selectively acts only on the protective layer but not on the optical coating and only minimally on the solder layer system such that the metallization of the solder layer system adhering to the protective layer is lifted off by means of undercutting, and the solder layer system remains only on the locally machined peripheral edge regions circumscribing the optically active free-form surfaces.

In an advantageous manner, a laser beam, a particle beam or an electron beam can be used as directed machining beam.

In a preferred embodiment, by means of the directed machining beam of high-energy radiation during the ablation of the locally machined peripheral edge region of the substrate material which has at least one lowered step and rounded edges with radii R between 50 and 150 µm in an inner and an outer edge area such that there is obtained in step e), through the complete coating with the solder layer system, a low-tension metallization of the locally machined peripheral edge region and an additional edge coverage for a subsequently applied solder of the solder layer.

In an advisable manner, the locally machined edge region is freed from loose and loosely adhering material by means of a cleaning process and a defined roughness of the surface of at most $Ra_{max}=2.5$ µm is adjusted. The cleaning process can preferably be carried out by machining by means of a laser beam, particle beam, electron beam, glass beads or etching liquid.

For purposes of technical efficiency and for reasons relating to depaneling technology, a plurality of window elements are preferably produced on the wafer-shaped substrate material.

To this end, the individual window elements are preferably cut out of the substrate material along cutting lines after the metallization is removed from the optical coating in step f).

In an alternative variant, the individual window elements can also be cut out of the substrate material along cutting lines right after the removal of the edge areas of the window elements in step d).

In both variants, the window elements are advisably cut out by cutting through the substrate material along the cutting lines from the front side, and the front side is the surface of the substrate material that is intended for the solderable metallization.

It proves advantageous when weakenings which extend corresponding to the cutting lines are introduced at the back side of the substrate material before cutting through the substrate material. For this purpose, a supporting substrate can be provided in addition, and the substrate material can be affixed to the supporting substrate by an adhesive agent for every window element.

The window elements can advisably be cut out by means of a directed machining beam of high-energy radiation by repeatedly moving the directed machining beam over the cutting lines, and rounded edges with the required radii R can be generated along the cutting lines at the same time.

In addition to the rounded edges, beveled lateral faces which are inclined inward towards a surface normal of the window element can be generated when cutting out the window elements by the repeated movement of the directed machining beam over the cutting lines.

In a further preferred embodiment, the cutting out of the window elements by repeatedly moving the directed machining beam over the cutting lines can be carried out in direct connection with the ablation of the lowered step of substrate material which is carried out by the directed machining beam and, in so doing, the rounded edges with radii R in the double-digit to triple-digit micrometer range can be produced along the cutting lines.

In order to improve the resistance of the optical coating to etching processes and mechanical stress, a silicon nitride layer, zinc sulfide layer or a DLC (diamond-like carbon) layer, or a layer comprising an oxide of silicon, magnesium, aluminum, or a layer comprising a fluoride of yttrium, ytterbium, barium, or a semiconductor layer comprising germanium or silicon can advantageously be used as a terminating layer of the optical coating.

A metallic protective layer is preferably arranged on the optical coating as protective layer and lift-off mask. To this end, the protective layer can be produced with at least one of the metallic materials from the group including aluminum and aluminum alloys such as aluminum-silicon alloys, aluminum-magnesium alloys, aluminum-lithium alloys, and nickel and nickel-iron alloys.

In addition, the metallic protective layer can be supplemented with a polymer layer before overlaying with the solder layer system if the lift-off process is to be facilitated in case of thick solder layer systems. However, arranging exclusively a polymer layer (e.g., a photoresist layer) on the optical coating as protective layer is also possible.

The above-stated object is further met through free-form window elements for apertures of any shape in a housing for soldering into the housing in a hermetically tight manner which are produced according to one or more of the preceding method variants.

The free-form window elements for apertures of any shape in a housing which are produced by one or more of the preceding production methods are preferably used for producing gastight or vacuum-tight optoelectronic or electrooptical components.

The invention is based on the empirical insight that the known additional adhesive agent layers for enhancing the reliability of the hermetically tight solder connection do not produce the required long-term results under alternating thermal load so that, in order to guarantee the tightness of the housing-window joint over the long term, a more intimate contact must be produced between the solder coating and window material and, in addition, this more intimate contact should not impose an additional technological burden on the optical filter layers and, further, should minimize unwanted extraneous radiation (stray radiation and other interference radiation) at the edge of the filter system. Further, the window shape should not be limited to rectangular, square or circular windows as was the case heretofore.

According to the invention, these problems are solved in that the ablation of the optical coating in the edge region by beam machining with a high-energy beam (laser beam, electron beam or particle beam) takes place up to an appreciable distance into the substrate of the window (ablation of a substrate step of more than the thickness of the optical coating) which permits free-form surfaces of any shape to be produced simultaneous with a material ablation "circumscribing" the required optically active surface and makes possible a direct application of the metallization with the solder layer system with a defined ablation surface roughness remaining. In this way, the known lift-off method for solder metallization of the optically active free-form surface of the individual window elements is reduced solely to the undercutting of a protective layer which has been arranged over the optical coating beforehand and which is required for the energy beam machining and which accordingly performs a dual function (protective layer and lift-off mask).

It is achieved in this way, on the one hand, that no additional overall coating with adhesion agent layers is required so that the lift-off process of the solder system is also simplified and, on the other hand, the ablation of the optical coating which is carried out by beam optics makes free-form windows possible, which permits a low-tension solder connection for the coating-free, additionally stepped edge zone by rounding the edges of the substrate of a window element in (radial) width and depth. The substrate gradation obviates an additional barrier layer and interdiffusion layer by maintaining a determined surface roughness so as to facilitate the method for the production of hermetically gastight, solderable window elements and increase the long-term reliability of the hermetically tight solder connection at the same time.

The invention allows the production of optical window elements which—even under alternating thermal load—ensure a long-term reliable hermetically gastight or vacuum-tight solder connection with a metallic housing and, in so doing, also minimize the penetration of stray radiation and interference radiation into the optical layer system. Further, the production of free-form window surfaces is made possible through the type of edge ablation which simultaneously increases the long-term stability of the solder connection.

BRIEF DESCRIPTION OF THE DRAWINGS

The invention will be described more fully in the following referring to embodiment examples and drawings. The drawings show.

DETAILED DESCRIPTION OF THE PREFERRED EMBODIMENTS

Figure 1:
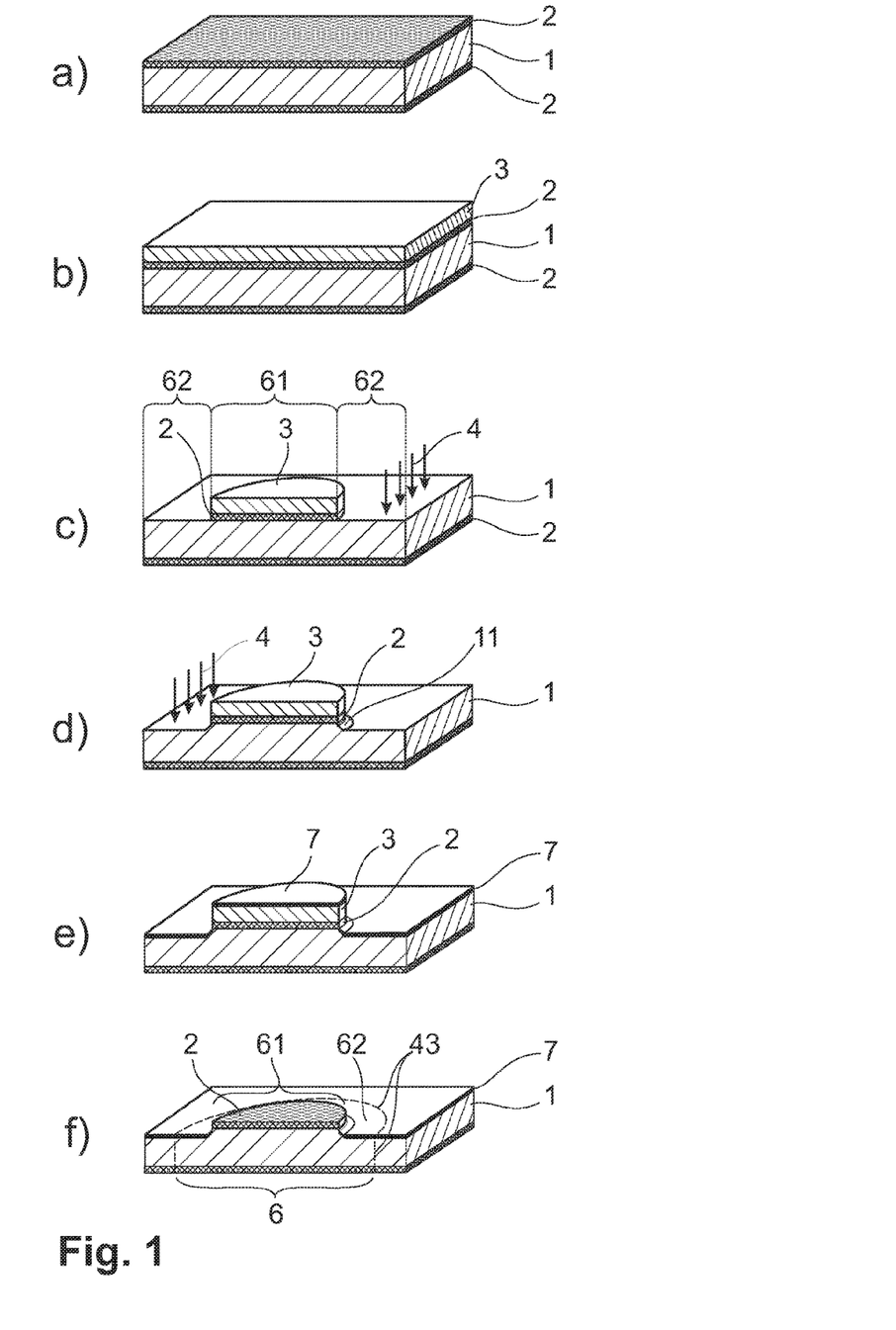
FIG. 1 is a basic variant of the method according to the invention for producing a window element with optical coating and solder metallization.

In a basic variant according to FIG. 1 which is a schematic rendering of the method sequence, the method for the production of window elements 6 which can be soldered into a housing 9 in a hermetically tight manner comprises the following steps:

a) applying at least one optical coating 2 to at least one surface of an optically transparent, flat substrate material 1, b) coating the optical coating 2 with a protective layer 3 which is an etchable layer, meaning a sacrificial layer, for an optical coating 2 which is resistant to etching in this respect, c) selectively removing the protective layer 3 and the optical coating 2 from the substrate material 1 in that, for window elements 6 with any geometric shape, at least one required optically active free-form surface 61 is ablated through localized machining by means of a directed machining beam 4 of high-energy radiation in edge regions 62 which circumscribe the periphery of the at least one optically active free-form surface 61 such that the protective layer 3 remains on the optical coating 2 as a mask which completely covers the required optically active free-form surface 61, d) ablating a portion of the substrate material 1 along the locally machined peripheral edge region 62 by means of the directed machining beam 4 of high-energy radiation such that at least one lowered step 11, 12 having a defined roughness is formed in the locally machined edge region 62 of the substrate material 1, wherein the step 11 lies below a height level of the substrate material 1 at which the optical coating 2 is disposed by more than the single layer thickness of the optical coating 2, e) coating a surface of the substrate material 1 having the optical coating 2 covered by the protective layer 3 and having the locally machined peripheral edge region 62 of the at least one window element 6 through overlaying metallization 7 of the aforementioned surface with a solderable coating, and f) removing the metallization 7 over the optical coating 2 by means of an etching process which selectively acts only on the protective layer 3 but not on the optical coating 2 and only minimally on the metallization 7 such that the metallization 7 adhering to the protective layer 3 is lifted off by means of undercutting, and the metallization 7 remains only on the locally machined peripheral edge regions 62 circumscribing the optically active free-form surfaces 61.

Silicon, germanium, barium fluoride, calcium fluoride, zinc sulfide or sapphire (only transparent up to 5.5 µm) are preferably used as substrate material 1.

Optical coatings can vary widely in type. They range from antireflective layer systems (e.g., AR filter 21) through a wide variety of spectral edge filters and bandpass filters to interference filter systems with very specific spectral characteristics (collectively referred to hereinafter as spectral filter system 22 or, abstractly, as optical coating 2). The latter interference filter systems in particular are preferably arranged on the (technical) upper side of the window element 6 which also carries the metallization 7 for the solder connection and which is subsequently the inner side of the window element 6. In contrast, the (technical) back side of the window element 6 which is subsequently installed at the housing 9 as outer side is more commonly—although not exclusively—coated with antireflective coatings, absorption filters and reflection filters.

When selecting the protective layer 3 for the optical coating 2 arranged on the upper side of the window element 6, good wet-chemical etching behavior as well as resistance to the ablation products of the high-energy machining beam 4 are especially taken into account. Mainly materials such as aluminum and alloys thereof (e.g., Al—Si, Al—Mg, Al—Li) or nickel and nickel-iron alloys are used for this purpose.

Large layer thicknesses (between 100 nm and 5 μm) for sufficient layer stability and short etching times (between 1 min and 10 min, optimally 2-3 min) for the lift-off process are preferred. Alternative protective layers 3 of chromium or titanium require only smaller layer thicknesses (between 50 nm and 1 μm) for this purpose.

However, larger layer thicknesses of the protective layer 3 of up to 8 μm are sometimes required for layer ablation by the machining beam 4 in order to afford sufficient protection (e.g., against plasma spatter). In such cases, thicker polymer layers (e.g., photoresist) or a composite of the aforementioned metallic layers and polymer layers can also be formed.

Another crucial method step aside from the complete ablation of the protective layer 3 and optical coating 2 is the continued graduated ablation of the substrate material 1 by means of the machining beam 4. To this end, first and foremost, a defined roughness of the edge region 62 must be provided around the required optically active free-form surface 61 and adjusted as homogeneously as possible within the range between 0.5 μm and 2.5 μm to enable a reliable and long-lasting adhesion of the solder layer system 71. The homogeneity is achieved in that the ablation lines of the machining beam 4 extend so as to circumscribe the optically active free-form surface 61 parallel to the edges. On the other hand, the ablation of at least one step 11 which is lowered below the base level of the optical coating 2 by more than the layer thickness of the optical coating 2 ensures that interference light subsequently coupled into the optical coating 2 from the edge region 62 of the metallization 7 is suppressed to a great extent.

Since technological efficiency is always a concern in the production of window elements 6, producing a plurality of different window elements 6 on a common substrate material 1 (wafer) also requires cutting out the individual window elements 6, which can be carried out as a process step at various points in the coating and ablation process. To this end, various possibilities are indicated in the following method variants.

Figure 2:
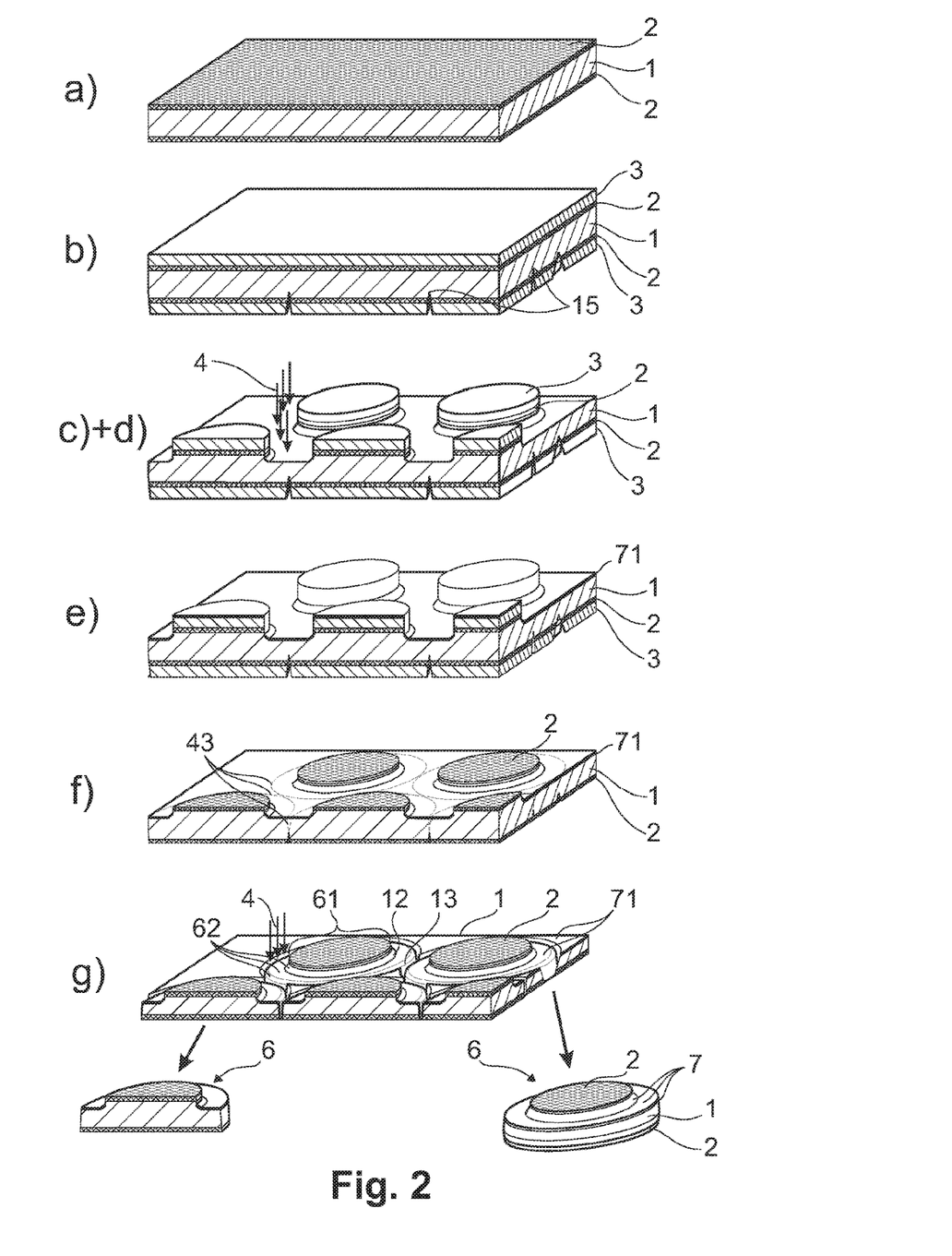
FIG. 2 is an advantageous embodiment of the method for producing a plurality of window elements.

In a first variant of the method according to FIG. 2, the optically transparent, flat substrate material 1, which is made, e.g., of silicon (Si) or germanium (Ge) or sapphire ($Al_2O_3$) or fused silica ($SiO_2$) or calcium fluoride ($CaF_2$) and is of a sufficient size for a plurality of window elements 6, is machined consecutively by the following steps:

a) applying optical coatings 2 (e.g., coating layer, antireflective coating or filter coating) to both faces of the substrate material 1, b) coating the two faces of the substrate material 1 with a protective layer 3 for the optical coatings 2 (e.g., metallic layers for laser machining) and making notches 15 on the back side of the substrate material 1 in accordance with the desired shape of the optically active free-form surface 61 of the window elements 6 in order to prevent broken edges when cutting out the window elements 6 subsequently, c) selectively removing the protective layer 3 and the optical coating 2 from the substrate material 1 in the edge region(s) 62 circumscribing the optically active free-form surfaces 61 of the window elements 6 by means of a directed beam machining (laser machining, electron beam method, particle beam method and the like, or water jet method), and d) machining the optically active free-form surfaces 61 of the window elements 6 by means of a directed machining beam 4 of a Q-switched or modulatable solid state laser by carrying out a low-stress, low-residue machining in the edge region(s) 62 through laser sublimation, e) coating a metallization 7 which adheres to the substrate material 1 in the beam-machined edge regions 62, preferably through physical vapor deposition (PVD method) of solder layer systems 71 comprising, for example:
titanium (Ti)-platinum (Pt)-Gold (Au) or
titanium (Ti)-palladium (Pd)-Gold (Au) or
chromium (Cr)-iron-nickel alloy (FeNi)-gold-nickel alloy (AuNi) or
copper-nickel-gold alloy (CuNiAu)-nickel (Ni) or
through chemical process with nickel (Ni) and gold (Au), and f) lifting off the solder layer system 71 adhering to the protective layer 3 in that the protective layer 3 is removed in the subsequent etching process which acts only selectively on the protective layer 3 arranged on the optically active free-form surfaces 61, whereas the solder layer system 71 is minimally acted on and the optical coating(s) 2 are not acted on; the protective layer 3 is a lift-off mask for the optical coating 2 such that the metallization 7 is only retained on the substrate material 1 in the form of a solder ring structure in the edge regions 62 around the optically active free-form surface(s) 61, and g) cutting the window elements 6 out of the substrate material 1 by means of the machining beam 4 of a q-switched or modulatable solid state laser in that the machining beam 4 of the laser is moved along the selected cutting lines 43 on the front side which are congruent to the notches 15 on the back side (with the required shape of the optically active free-form surfaces 61 of the window elements 6).

Exemplary parameters of a laser beam for the layer ablation are preferably a spot diameter of 30 μm to 60 μm, a pulse frequency of 1 kHz to 1000 kHz, a laser power of 5 W to 60 W. By controlling the induced surface energy (by means of the type of beam deflection), the penetration depth of the laser beam and, therefore, the volume of the material ablation is determined, and a substantially homogeneous, wettable or coatable base is accordingly produced with a defined surface roughness of at most $Ra_{max}=2.5$ μm for receiving the solderable solder layer system 71.

Compared to known mechanical ablation methods, particularly score tear stresses in the optical coating 2 can be prevented during the layer ablation.

In a first embodiment, the protective layer 3 for the optically active free-form surfaces 61 is a metallic protective layer 3, preferably comprising aluminum (Al), which is deposited under defined process conditions during sputtering (e.g., substrate temperature of <180° C. and relatively high work pressures of 1.066 Pa<p <2.250 Pa) in layer thicknesses of 0.5 μm to 5 μm to produce a coarse crystal structure. This structure is optionally decorated by etching such that the aluminum possesses a low reflectivity in the range of the laser light wavelength (of preferably 1 μm) because of the resulting surface roughness.

Contamination from laser fouling and plasma spatter which commonly occur during the lasing process is prevented by the protective layer 3 which can have a total thickness of up to three times to five times the thickness of the solder layer system 71 for forming an effective lift-off mask and is used as lift-off mask by undercutting the protective layer 3 in order to remove the metallization 7 above the optical coating 2. A clean Al layer with thicknesses of >100 nm and <5 μm is used when applying the above-mentioned basic thickness adaptation of the protective layer 3. If thicker protective layers 3 (e.g., up to 8 μm) are needed, a polymer layer (e.g., known photoresist) or a composite of metal and polymer can also be used as materials for the protective layer 3. Aluminum alloys (e.g., aluminum-silicon alloys, aluminum-magnesium alloys or aluminum-lithium alloys) and nickel alloys and nickel-iron alloys can also be used for metallic protective layers 3 as an alternative to aluminum.

Possible free-form variants of the window elements 6 are shown in FIGS. 2 to 6. It will be appreciated that combinations of the shapes of the window elements 6 and shapes of the substrate material 1 (wafers or boards with a thickness in the range of 0.2 mm to 6 mm with optical coatings 2 for UV light, IR light and visible light) are possible and are included in the disclosed subject matter of the invention. For a depaneling technology selected in accordance with FIG. 4 and FIG. 6 making optimum use of available surface, ridge widths between 0.5 mm and 1 mm are useful and sufficient for cutting out the individual window elements 6 when the cutting is done with a machining beam 4 of high-energy radiation (e.g., laser beam) during the proposed beam machining The beam machining is advantageously characterized in that, through a first phase of the beam machining of the metallic protective layer 3 in which the coupling of the laser into the optical coating 2 (also into the highly-reflective coating layer) is also initiated, the optical coating 2 is ablated and melted, giving rise to a defined (selectable in the range of 0.5 μm<Ra<2.5 μm) and extensively homogeneous surface roughness which ensures that the beam is coupled in regardless of the characteristics of the individual optical layers without requiring a special laser, and, in a second phase, a portion of the substrate material 1 with at least one step 11 (with a height of more than the total thickness of the optical coating 2) is ablated below the base level of the optical coating 2 and is finished with the above-mentioned surface roughness. The step 11 is preferably lowered by twice the layer thickness of the optical coating 2.

Figure 3:
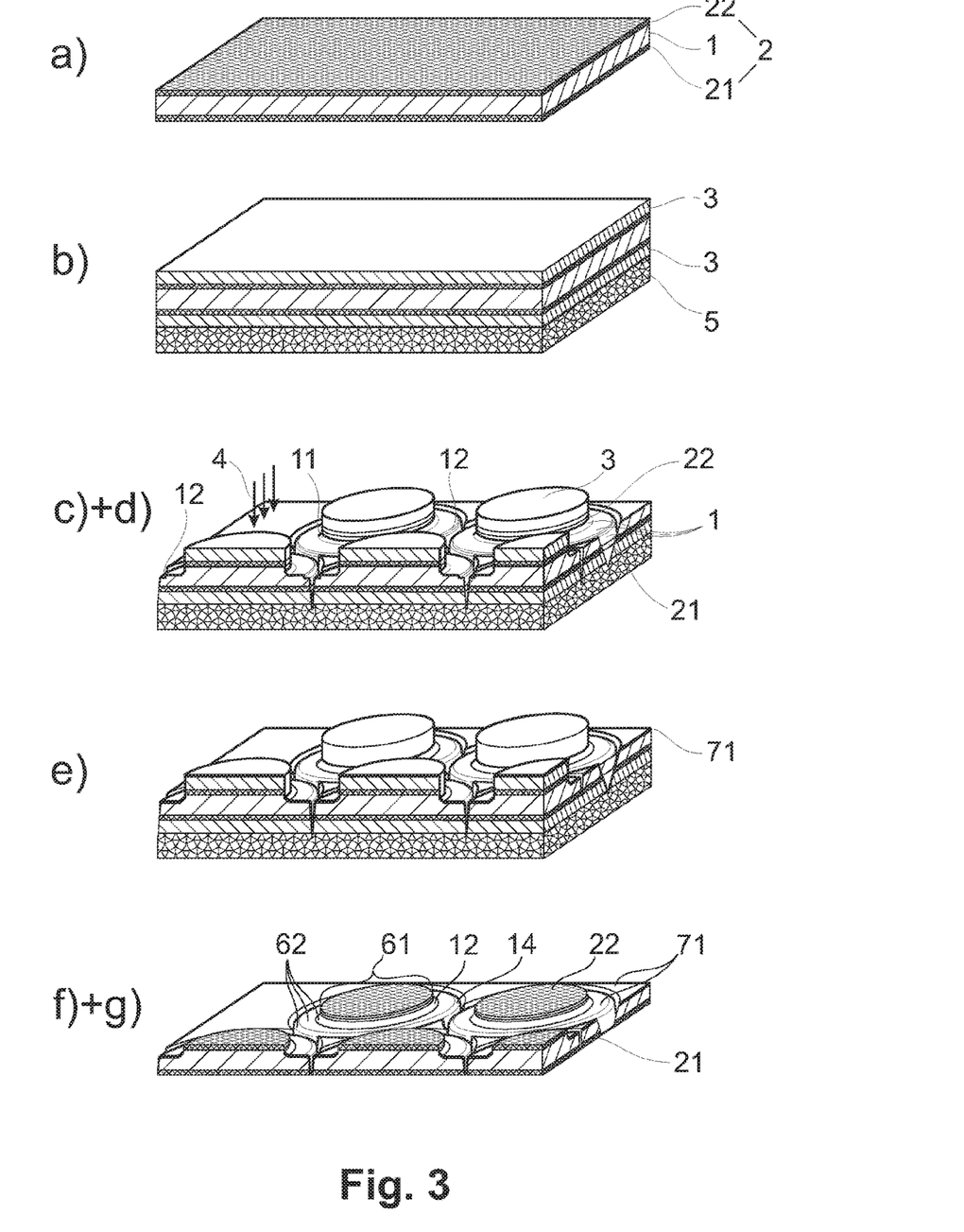
FIG. 3 is a further preferred embodiment of the method for the production of a plurality of window elements
Figure 4:
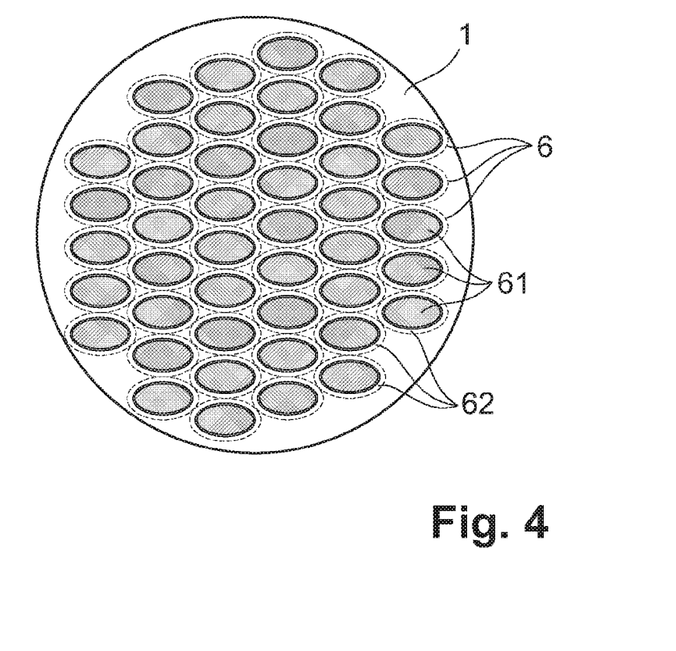
FIG. 4 is an arrangement of identical window elements on a substrate material in the form of a wafer for the most efficient depaneling technology.

In a second variant of the method according to FIG. 3, the optically transparent, flat substrate material 1 is machined consecutively by the following steps:

a) applying different optical coatings 2 to both faces of the substrate material 1 according to FIG. 3 in that an antireflective coating in the form of an AR filter 21 is arranged on the one face and a spectral filter system 22 is arranged on the other face, b) coating the two faces of the substrate material 1 with a protective layer 3 comprising a polymer (e.g., negatively acting photoresist) for the optical coatings 2, and affixing an additional supporting substrate 5 to the back side of the substrate material 1 such that the required window elements 6 (see FIG. 2) are fixed at least at points in each instance (for example, with double-sided adhesive tape), c) selectively removing the protective layer 3 and the optical coating 2 from the substrate material 1 in the edge region(s) 62 circumscribing the optically active free-form surfaces 61 of the window elements 6 by means of a directed beam machining with a machining beam 4, and d) further machining the optically active free-form surfaces 61 of the window elements 6 by means of the machining beam 4 for forming the at least one step 11 in the substrate material 1 in that a low-stress, low-residue machining is carried out in the edge region(s) 62 of the window elements 6 through laser sublimation, and immediately thereafter g) cutting out the window elements 6 corresponding to the required shape of the window elements 6 by means of a machining beam 4 in the form of an electron beam, and then proceeding in the manner already set forth in the method sequence according to FIG. 2 by e) applying a metallization 7 with the solder layer system 71, preferably through physical vapor deposition (PVD method) of solder layer systems 71 which adhere to the substrate material 1 in the beam-machined edge regions 62, and f) lifting off the metallization 7 adhering to the protective layer 3 in that the protective layer 3 is removed in an etching process which selectively acts on the previously applied protective layer 3 such that only a metallization 7 is retained as solder ring structure on the substrate material 1 in the edge regions 62 around the optically active free-form surface(s) 61, and g) simultaneously detaching the window elements 6 from the supporting substrate 5 such that the window elements 6 are singled.

In a particular embodiment, the beam machining (e.g., by laser ablation) in step 11 and in a further step 12 (shown only in FIG. 3, steps c) and d)) is carried out in such a way that a step 11 is generated in the solder layer system 71 in the edge region 62 around the optically active free-form surface 61 of the window element 6 in the planar solder range of 50 μm-200 μm, which step 11 is lowered below the base surface of the optical coating 2 somewhat deeper than the thickness of the optical coating 2, preferably up to twice the thickness of the optical coating 2, and a further step 12 in the range of 200 μm-500 μm is generated in the outer edge region 62.

Figure 5:
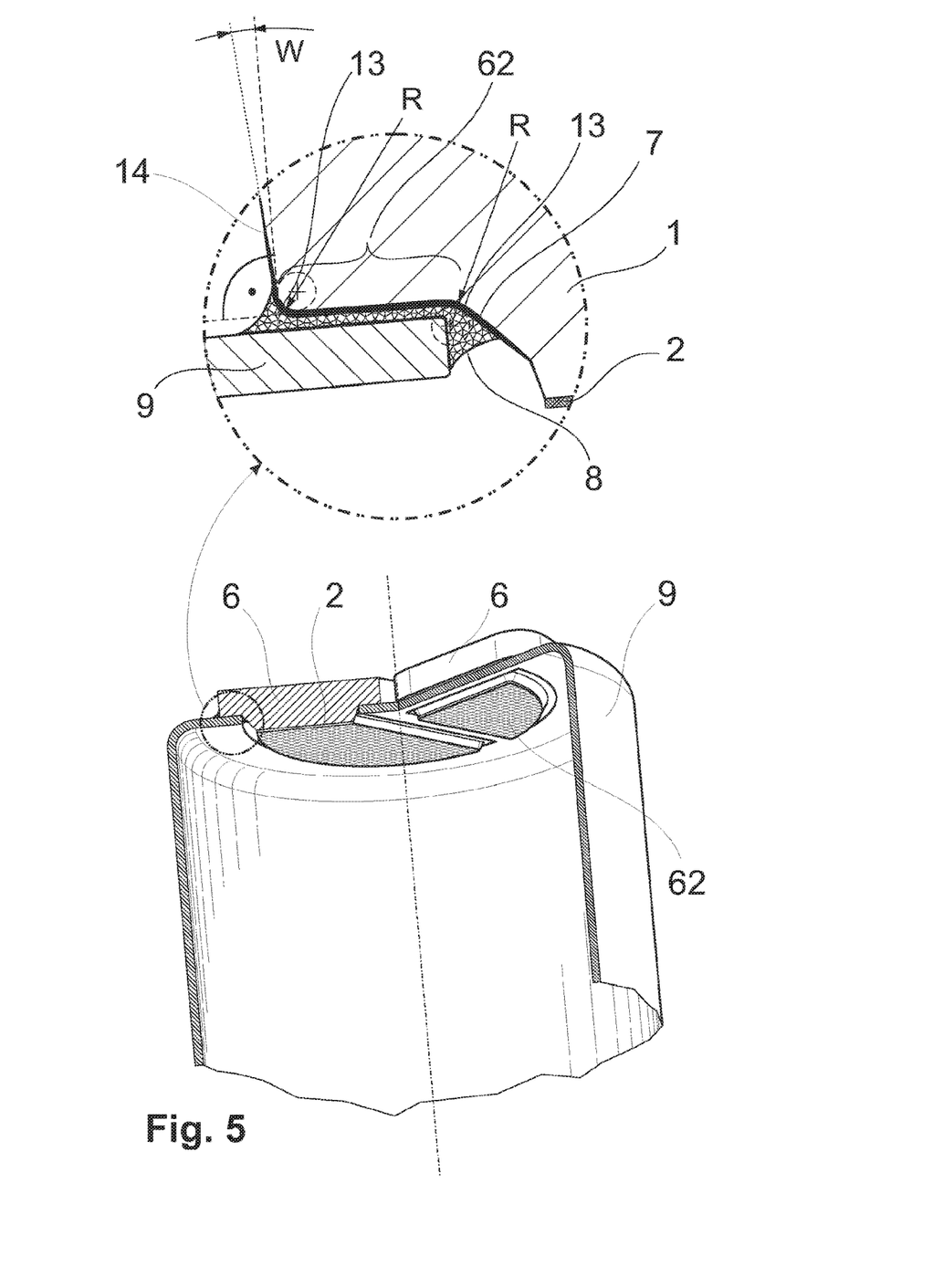
FIG. 5 is a perspective view of a housing cap with window elements produced according to the invention with an enlarged detail of the edge region of the window element as sectional drawing with finished solder connection.
Figure 6:
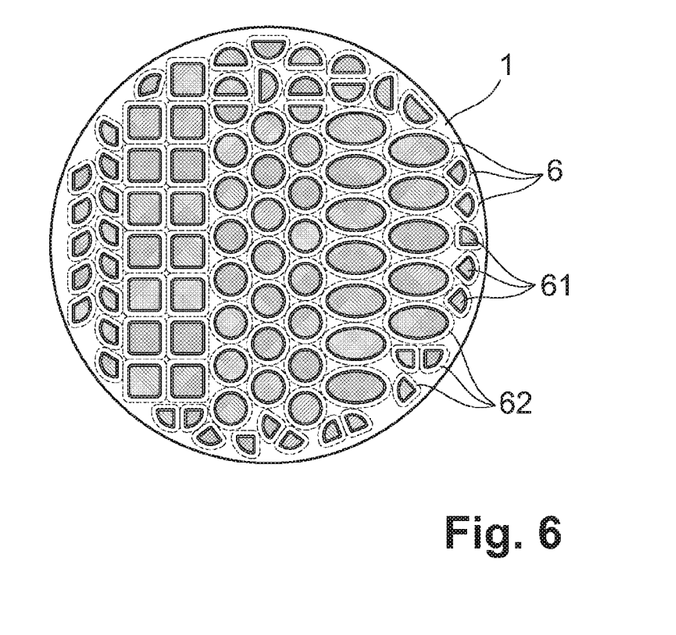
FIG. 6 is a preferred arrangement of optionally varying window elements on substrate material in the form of a wafer for the most efficient depaneling technology for diverse applications.

The further step 12, which can also be formed only as rounded edge 13 with a radius R between 50 and 150 μm (as is shown in FIG. 5), ensures that the metallization 7 is arranged not only in a planar manner on the contact face of the window element 6 relative to the housing 9, but that the edge of the window element 6 is also coated with a solder layer 8 so as to minimize score tears in case of thermal or mechanical loads (see FIG. 2, FIG. 3 and particularly the detail in FIG. 5). In so doing, the step 11 for lowering the level of the contact surface to below the base level of the optical coating 2 ensures a solder bond surrounding the edge of the housing without reflected light or stray light or any other interference light entering the filter layers of the optical coating 2 from the solder layer 8.

Further, the step 11 of ablated substrate material to below the base surface of the optical coating 2 contributes to reducing the thickness of the protective layer 3 which should conventionally have three times to five times the required thickness of the solder layer system 71 lying on top of it in order to have sufficient stability for the lift-off process for ensuring the uncovering of the optical coating 2 because there is a high lateral etching zone for the etchant on the protective layer 3. Accordingly, the protective layer 3 can be reduced to a thickness that is at least greater than or equal to the thickness of the solder layer system 71.

Further, the surface of the substrate material 1 is textured by the laser machining with respect to roughness such that an enlarged surface is made available for the solder bond after metallization 7 and thus leads to an improved system stability with respect to the hermetically tight joint system. As a result of the larger soldering contact surfaces brought about by roughness and by the rounded edge 13 and a beveled lateral face 14, the ridge width of the edge regions 62 of the window elements 6 can also be reduced from typically 500 μm to 800 μm down to 100 μm with improved system stability of the hermetic seal. An optimum range is between 300 and 500 μm. While radii R between 50 and 150 μm, optimally 80-100 μm, are preferably used for the rounded edges 13, the beveled lateral faces 14 of the window elements 6 are inclined toward the machined edge region 62 as solder contact face (clearly visible in the enlarged section in FIG. 5). A bevel angle W of the outer edge of between 1° and 15° relative to the surface normal of the solder contact face is suitably selected and bevel angles between 8° and 12° are preferred.

FIG. 5 further shows a sectional view of a housing 9 in which at least two window elements 6 of different shape are inserted. The window elements 6 are quarter-circle-shaped or half-circle-shaped free-form surfaces 61 with rounded corners. Without limiting generality, the optical coating 2 is arranged only on the inner side of the window element 6. The enlarged section shows the metallization 7 and solder layer 8. It is key in this respect that all of the edge transitions of the window element 6 are formed as rounded edges 13 such that the solder material of the solder layer 8 clings to the solder ring structure of the window element with low tension and in a supportable manner. The thickness of the solder layer 8 is primarily determined by the selected roughness of the surface of the window element 6 that is ablated as step 11 and is between 300 nm and 5 µm, preferably between 1 and 3 µm, the greater thicknesses being used in case of greater surface roughness (up to 2.5 µm).

In case of an optical coating 2 (antireflective [AR] and/or spectral filter) through the metallic protective layer 3, the coupling of the laser into the optical layers of the optical coating 2 can be initiated in a simpler manner. Roughening by means of pitting of the Al layer (which should be greater than 100 nm and no more than 5 µm) or thin absorbent layers of Cr, Ti, etc. (which have a layer thickness of between 50 nm and 1 µm) is conducive for this purpose.

Figure 7A:
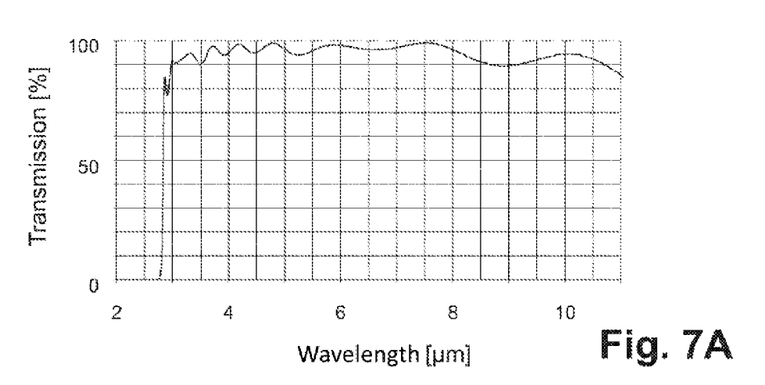
FIGS. 7A, 7B, 7C are the characteristic transmission behavior over wavelength for window elements of different substrate materials with different optical coatings, where 7A—germanium substrate with AR coating (anti-reflective coating) for a wavelength range of from 3 to 11 µm; 7B—silicon substrate with longpass filter for 8 to 12 µm; and 7C—barium fluoride substrate with bandpass filter for 5.7 to 7 µm.
Figure 7B:
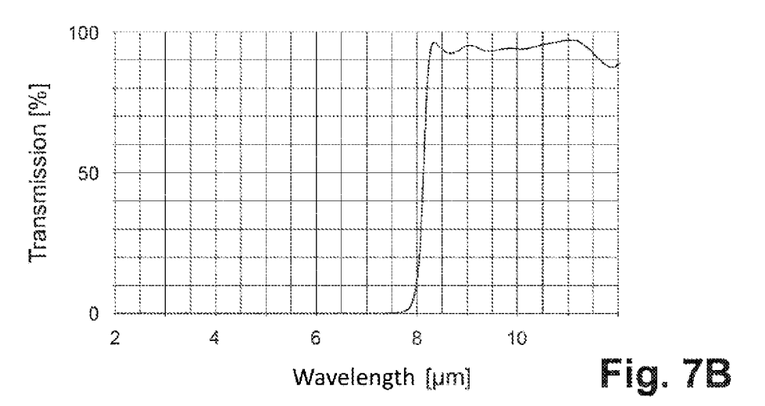
Figure 7C:
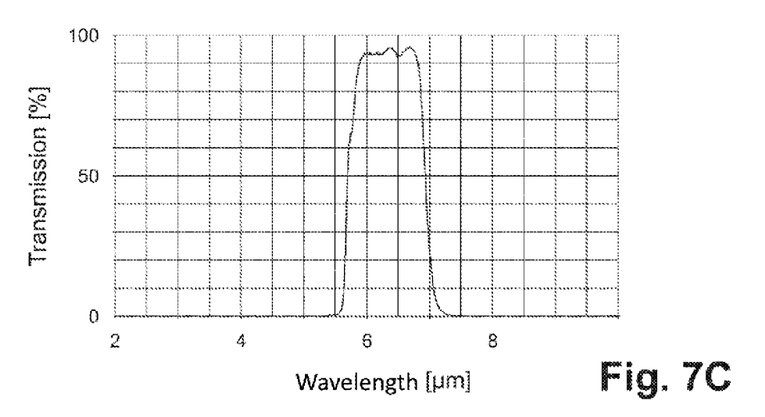

Examples of possible optical coatings 2 of a window element 6 which are arranged on a wafer as substrate material 1 and whose wavelength-dependent transmission characteristics are shown in FIGS. 7A-C are, for example, an antireflective coating (AR filter 21) for the range of 3 to 11 µm on a Ge substrate (FIG. 7A) or, as an example of an optical coating 2 which can preferably be arranged on the outer side but also, alternatively, on the inner side of the window element 6, a longpass filter for 8 to 12 µm on a Si substrate (FIG. 7B) or a bandpass filter for 5.7-7 µm on a $BaF_2$ substrate (FIG. 7C).

To increase the resistance of the optical coating 2, an upper terminating layer can advantageously be arranged. This upper terminating layer can be a silicon nitride layer, zinc sulfide layer or a DLC (diamond-like carbon) layer or a layer comprising an oxide of silicon, magnesium, aluminum, or a layer comprising a fluoride of yttrium, ytterbium, barium, or a semiconductor layer comprising germanium or silicon.

The vast majority of available optical coatings 2 (e.g., AR filter 21 and/or filter system 22) are either transparent or reflective for the laser wavelength used herein. A process-stable absorption of the radiation energy in the material is ensured by the generated metallic protective layer 3. This makes possible a sublimation or ablation of the protective layer 3, the optical coating 2 and the substrate material 1.

In an embodiment variant, the metallic protective layer 3 comprises aluminum (Al). The Al is dissolved by low-concentration NaOH (1 . . . 5%).

In further embodiments of the method according to the invention, nickel or nickel alloys such as iron-nickel alloys, or aluminum-silicon alloys, aluminum-magnesium alloys, aluminum-lithium alloys can be used.

The method can be further optimized in that the optically active free-form surface 61 is completely cut out after partial ablation of the metallic protective layer 3 or polymer protective layer 3 (e.g., photoresist layer) and optical coating 2, and the window elements 6 have been partially fixed to the supporting substrate 5 beforehand, as is shown in FIG. 3, by selective gluing or pasting such that they can be cleaned and coated with the solder layer system 71 in this variant.

The technical sequence is as follows:
$a_0$) first cleaning (usually with water and ultrasound),
a) application of the optical coating(s) 2,
b) arrangement of the protective layers 3, preferably on both sides,
$c_{01}$) etching of the protective layer 3 for improved laser input,
$c_{02}$) preparation of the supporting substrate 5 with sticky pads or paste silkscreening,
$c_{03}$) gluing a wafer to the supporting substrate 5 solder side up,
c) first laser machining step (ablation of protective layer 3 and optical coating 2),
d) second laser machining step (cutting out the surface structure of the window elements 6),
$e_0$) second cleaning,
e) coating with the solder layer system 71,
g) cutting out the window elements 6 and detaching from the supporting substrate 5, storing,
f) lifting off the metallization 7 from the optically active free-form surfaces 61 by undercutting the protective layer 3.

An optical coating 2 having a terminating layer which is resistant to the weak alkalis that are applied for etchback of the protective layer 3 is used. A silicon nitride layer, zinc sulfide layer or DLC (diamond-like carbon) layer is particularly suitable as terminating layer.

LIST OF REFERENCE CHARACTERS 1 substrate material
11 step (of the substrate material ablation)
12 further step (of substrate material ablation)
13 rounded edge (of the window element 6)
14 beveled lateral face (of the window element 6)
15 notching (on back side)
2 optical coating
21 AR filter
22 (spectral) filter system
3 protective layer
4 machining beam (high-energy radiation)
43 cutting lines (for cutting out the window elements 6)
5 supporting substrate
6 window element
61 optically active free-form surface
62 edge region (solder edge)
7 metallization
71 solder layer system
8 solder layer
9 housing
R radius
W bevel angle (of the lateral face)

What is claimed is:

1. A method for production of window elements for soldering into a housing in a hermetically tight manner in which optically transparent, flat substrate material having dimensions sufficient for a plurality of window elements is machined consecutively according to the following steps:
   a) applying at least one optical coating to at least one surface of the optically transparent, flat substrate material;
   b) coating the optical coating with a protective layer which is an etchable layer, meaning a sacrificial layer;
   c) selectively removing the protective layer and the optical coating from the substrate material for generating window elements of any geometric shape by ablating peripheral edge regions of the window elements with a directed machining beam of radiation and circumscribing a periphery of at least one optically active free-form surface to form a window element such that the protective layer remains on the optical coating as a mask covering the at least one optically active free-form surface;

d) ablating a portion of the substrate material along the peripheral edge regions with the directed machining beam of radiation and forming at least one lowered step in the substrate material in the peripheral edge regions of the window element, wherein the ablating of the at least one lowered step is carried out with a defined roughness and to a height level of the substrate material being below the optical coating by more than a thickness of a single layer of the optical coating, and ablating further portions of the substrate material along the peripheral edge regions of the window element with the directed machining beam of radiation to form rounded edges with radii R between 50 and 150 micrometers at an inner and an outer edge area of the at least one lowered step to obtain a tension-relieved metallization of the peripheral edge regions and an additional edge coverage for a subsequently applied solder;

e) coating a surface of the substrate material having the optical coating covered by the protective layer and having the peripheral edge regions ablated by the directed machining beam of radiation of the at least one window element through overlaying metallization of the surface of the substrate material with a solder layer system;

f) removing the metallization over the optical coating by selectively etching the protective layer without etching the optical coating and minimally etching the solder layer system, and lifting off the metallization of the solder layer system adhering to the protective layer by undercutting so that the solder layer system remains only on said peripheral edge regions circumscribing the at least one optically active free-form surface; and g) cutting out individual window elements from the substrate material along cutting lines by the directed machining beam either after the metallization is removed in step f) or after the ablation of the peripheral edge regions of the window elements in step d).

2. The method according to claim 1, wherein a laser beam, a particle beam or an electron beam is used as the directed machining beam.

3. The method according to claim 1, further comprising adjusting roughness of the surface of the substrate material by cleaning the peripheral edge regions from loose and loosely adhering material.

4. The method according to claim 3, wherein adjusting roughness is limited to a maximum roughness is $Ra_{max}=2.5$ micrometers.

5. The method according to claim 3, wherein cleaning is carried out by a laser beam, particle beam, electron beam, glass beads or etching liquid.

6. The method according to claim 1, wherein the window elements are cut out by cutting through the substrate material along the cutting lines from a front side, wherein the front side is the surface of the substrate material intended for metallization.

7. The method according to claim 6, further comprising forming weakenings which extend corresponding to the cutting lines at a back side of the substrate material before cutting through the substrate material.

8. The method according to claim 6, further comprising providing a supporting substrate to which the substrate material is affixed by an adhesive agent for every window element before cutting through the substrate material.

9. The method according to claim 8, further comprising singling out window elements which were already cut out from the substrate material in step g), by removing the singled out window elements from the supporting substrate.

10. The method according to claim 6, further comprising cutting out the window elements with the directed machining beam of radiation by repeatedly moving the directed machining beam over the cutting lines, and at the same time generating rounded edges with radii R along the cutting lines.

11. The method according to claim 10, further generating beveled lateral faces inclined inward towards a surface normal of the window elements when cutting out the window elements by a repeated movement of the directed machining beam over the cutting lines.

12. The method according to claim 10, further comprising cutting out the window elements by repeatedly moving the directed machining beam over the cutting lines in direct connection with ablating the lowered step of the substrate material by the directed machining beam and producing the rounded edges with the radii R in a double-digit to triple-digit micrometer range along the cutting lines.

13. The method according to claim 1, further comprising using a silicon nitride layer, zinc sulfide layer or a diamond-like carbon DLC layer or a layer comprising an oxide of silicon, magnesium, aluminum, or a layer comprising a fluoride of yttrium, ytterbium, barium, or a semiconductor layer comprising germanium or silicon as a terminating layer of the optical coating.

14. The method according to claim 1, wherein a metallic protective layer is arranged on the optical coating as the protective layer.

15. The method according to claim 1, further comprising producing the protective layer with at least one metallic material selected from the group consisting of aluminum and aluminum alloys, including aluminum-silicon alloys, aluminum-magnesium alloys, aluminum-lithium alloys, and nickel and nickel-iron alloys.

16. The method according to claim 14, further comprising supplementing the metallic protective layer by a polymer layer before overlaying with the solder layer system if a lift-off process is to be facilitated in case of thick solder layer systems.

17. The method according to claim 1, further comprising applying a polymer layer to the optical coating as the protective layer.

* * * * *

UNITED STATES PATENT AND TRADEMARK OFFICE
CERTIFICATE OF CORRECTION

PATENT NO. : 10,330,941 B2
APPLICATION NO. : 14/939385
DATED : June 25, 2019
INVENTOR(S) : Gittler et al.

Page 1 of 1

It is certified that error appears in the above-identified patent and that said Letters Patent is hereby corrected as shown below:

On the Title Page

At (73), change "Assignee: JENOPTIK Optical Systems GmbH, Hermsdorf (DE)" to "Assignees: JENOPTIK Optical Systems GmbH, Jena (DE); Micro-Hybrid Electronic GmbH, Hermsdorf (DE)"

Signed and Sealed this
Seventh Day of April, 2020

Andrei Iancu
*Director of the United States Patent and Trademark Office*